US007038913B2

(12) United States Patent
Lee et al.

(10) Patent No.: US 7,038,913 B2
(45) Date of Patent: May 2, 2006

(54) HEAT DISSIPATION ASSEMBLY INCLUDING HEAT SINK AND FAN

(75) Inventors: Hsieh Kun Lee, Tu-chen (TW); Cui Jun Lu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 227 days.

(21) Appl. No.: 10/662,018

(22) Filed: Sep. 11, 2003

(65) Prior Publication Data

US 2004/0136160 A1 Jul. 15, 2004

(30) Foreign Application Priority Data

Jan. 15, 2003 (TW) .............................. 92200669 U

(51) Int. Cl.
*H05K 7/20* (2006.01)

(52) U.S. Cl. ...................... 361/709; 361/688; 361/703; 361/687; 165/185

(58) Field of Classification Search ................ 361/709, 361/701, 825, 687, 688, 690, 692–697, 703; 165/80.3, 185; 174/16.3
See application file for complete search history.

(56) References Cited

U.S. PATENT DOCUMENTS

| | | | | |
|---|---|---|---|---|
| 6,392,885 | B1 * | 5/2002 | Lee et al. | 361/697 |
| 6,557,626 | B1 * | 5/2003 | O'Sullivan et al. | 165/121 |
| 2002/0060900 | A1 * | 5/2002 | Qiu | 361/683 |

FOREIGN PATENT DOCUMENTS

| | | |
|---|---|---|
| TW | 491513 | 6/2002 |

* cited by examiner

*Primary Examiner*—Kamand Cuneo
*Assistant Examiner*—Hung S. Bui
(74) *Attorney, Agent, or Firm*—Wei Te Chung

(57) ABSTRACT

A heat dissipation assembly includes a heat sink (100), a fan (200) and a fan holder (300). The heat sink includes a plurality of fins (110) and defines a groove (122) in the fins at a base end thereof. The holder includes a bracket (310). The fan is secured to a first main side of the bracket. A locating flange (352) is formed adjoining an edge of a second main side opposite to the first main side of the bracket. A pair of locking flanges (362) is formed adjoining opposite edges of the second main side of the bracket, disposed at opposite sides of the locating flange. The locating and locking flanges are received in the groove of the heat sink and abuttingly engaged with an inner defined at the heat sink in the groove. The base end of the heat sink is received between the bracket and the flanges.

18 Claims, 2 Drawing Sheets

212 210 200 214 320 342 340 344 366 310 330 364 300 362 360 356 352 350 354 122 120 110 100

HEAT DISSIPATION ASSEMBLY INCLUDING HEAT SINK AND FAN

BACKGROUND OF THE INVENTION

1. Field of the Invention

The present invention relates to a heat dissipation assembly including a heat sink and a fan, and more particularly to a heat dissipation assembly having a fan holder securely retaining the fan to the heat sink.

2. Description of Prior Art

Electronics technology continues to boom unabated. Numerous modern electronic devices such as central processing units (CPUs) of computers operate at high speed and thus generate large amounts of heat. The heat must be efficiently removed from the CPU; otherwise, abnormal operation or damage may result. Typically, a heat sink with good thermal conducting capability is mounted onto the CPU, and a fan is mounted onto the heat sink to enhance the heat dissipation capability thereof.

Most commonly, a fan is locked onto a heat sink by screws interferentially engaged with fins of the heat sink. Locking by this means is unduly laborious and slow. Additionally, the fins of the heat sink are generally thin and are liable to be deflected. Thus, the screws may loosen from the fins. The fan is liable to operate less efficiently, and may even become unserviceable.

To overcome the problems of the above-mentioned heat dissipation assembly, Taiwan Patent No. 491513 provides a heat dissipation assembly having a fan holder to mount a fan to a heat sink. The fan holder forms a plurality of catches for engaging with a periphery of the heat sink. Threaded posts are formed upwardly from the fan holder. The posts extend through holes of the fan and are engaged with corresponding nuts, thereby attaching the fan to the fan holder. However, the catches of the fan holder make it troublesome for the fan holder to be detached from the heat sink.

SUMMARY OF THE INVENTION

Accordingly, an object of the present invention is to provide a heat dissipation assembly including a heat sink and a fan, wherein the fan is conveniently secured to the heat sink via a fan holder.

In order to achieve the object set out above, a heat dissipation assembly in accordance with a preferred embodiment of the present invention comprises a heat sink, a fan and a fan holder. The heat sink comprises a plurality of radially distributed fins and defines a circumferential groove at a base end thereof. The heat sink defines an inner periphery in the groove. The holder comprises a bracket. The fan is secured to a first main side of the bracket. A locating flange extends away from an edge of a second main side opposite to the first main side of the bracket. A pair of locking flanges extends away from opposite edges of the second main side of the bracket. The locking flanges are disposed at opposite sides of the locating flange. The locating and locking flanges are received in the groove of the heat sink and abuttingly engaged with the inner periphery of the heat sink. The base end of the heat sink is received between the bracket and the flanges.

Other objects, advantages and novel features of the present invention will become more apparent from the following detailed description when taken in conjunction with the accompanying drawings, in which:

DETAILED DESCRIPTION OF THE INVENTION

Figure 1:
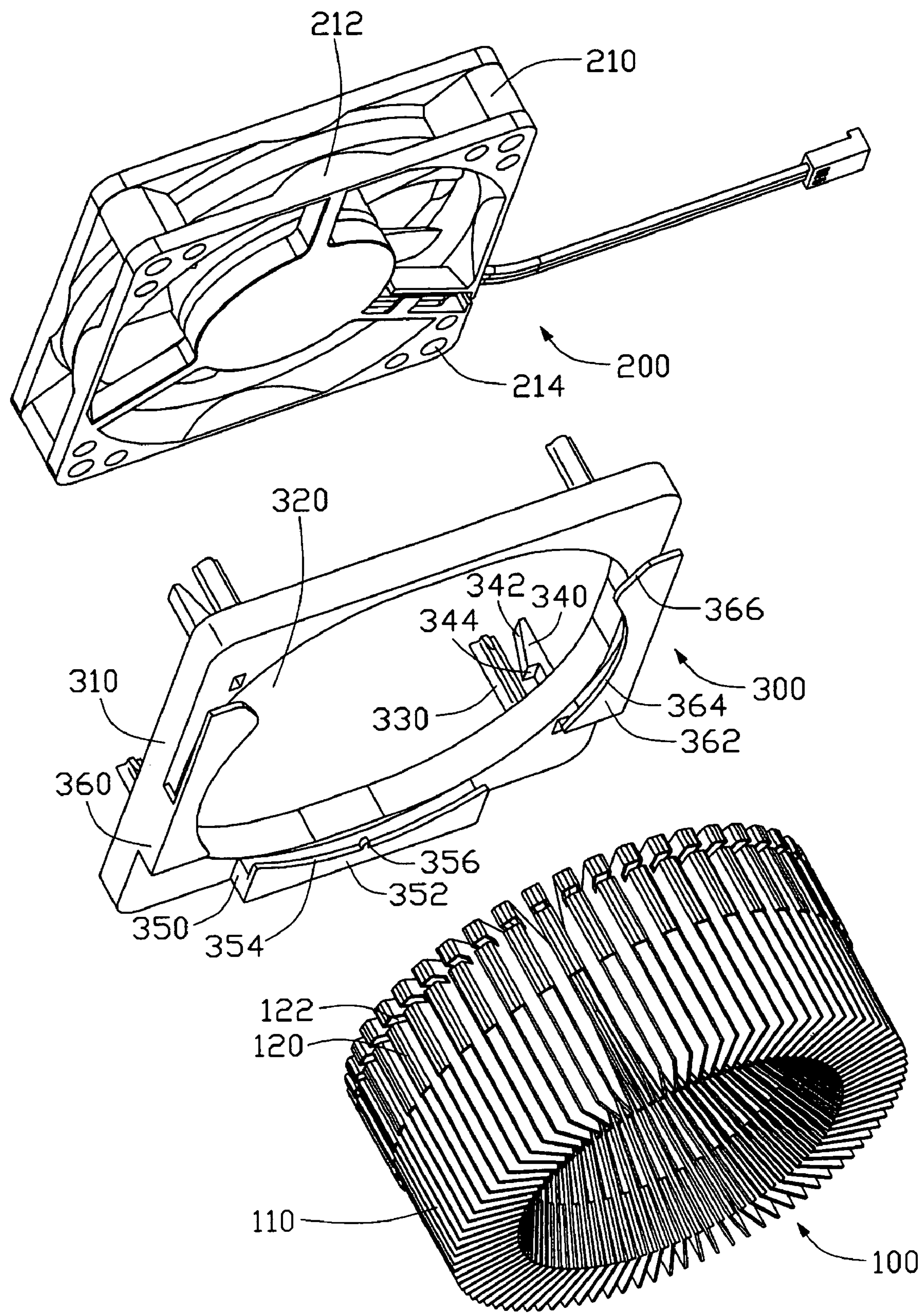
FIG. 1 is an exploded, isometric view of a heat dissipation assembly in accordance with the preferred embodiment of the present invention.

Referring to FIG. 1, a heat dissipation assembly in accordance with the preferred embodiment of the present invention comprises a heat sink 100, a fan 200, and a fan holder 300 readily securing the fan 200 to the heat sink 100.

The heat sink 30 comprises a multiplicity of radially distributed fins 110. A channel 120 is defined between each two adjacent fins 110. The fins 110 are integrally connected at a base end of the heat sink 100. A circumferential groove 122 is defined in the multiplicity of fins 110 near the base end of the heat sink 100.

The fan 200 comprises a rectangular frame 210. The frame 210 comprises a pair of parallel plates 212. Four locating holes 214 are defined through both of the plates 212, at four corners of the frame 210 respectively.

The fan holder 300 comprises a bracket 310 defining an opening 320 in a middle thereof, the opening 320 being for communication with the channels 120 of the heat sink 30. Four pins 330 extend perpendicularly from four corners of a first main side of the bracket 310, corresponding to the locating holes 214 of the fan 200. A pair of hooks 340 extends perpendicularly from diagonally opposite corners of said first main side of the bracket 310 respectively. The hooks 340 are adjacent an outer edge of the bracket 310, and adjacent corresponding pins 330 respectively. A guide face 342 is defined at an end of each hook 340, the guide face 342 generally facing toward an opposite lateral side of the bracket 310. A stopping face 344 is defined on each hook 340, the stopping face 344 being parallel to said first main side of the bracket 310. A distance is defined between the stopping face 344 and the bracket 310, corresponding to a depth of either plate 212 of the fan 200.

A locating portion 350 extends perpendicularly from a second main side of the bracket 310, said second main side being opposite from said first main side. The locating portion 350 is at a first lateral side of the bracket 310. A locating flange 352 extends inwardly from a top of the locating portion 350, the locating flange 352 being parallel to and spaced from the said second main side of the bracket 310. An arcuate locating face 354 is defined at an inner side of the locating flange 352, the locating face 354 corresponding to a periphery of the heat sink 100. A locating protrusion 356 is formed on a middle of the locating face 354, for engaging between two fins 110 of the heat sink 100 and preventing the heat sink 100 from rotating.

A pair of opposing locking portions 360 extends perpendicularly from said second main side of the bracket 310. The locking portions 360 are at opposite second and third lateral sides of the bracket 310 respectively, said second and third lateral sides each being adjacent said first lateral side. A locking flange 362 extends from a top of each locking portion 360. The locking flanges 362 are parallel to and spaced from said second main side of the bracket 310. An arcuate locking face 364 is defined at an inner side of each locking flange 362, the locking face 364 corresponding to a periphery of the heat sink 100. A leading face 366 is defined at an end of each locking flange 362 that is distal from the locating portion 350, the leading face 366 smoothly connecting with the corresponding locking face 364. The leading face 366 and the locking face 364 together span an entire length of the locking flange 362.

A distance between the bracket 310 and the locating and locking flanges 352, 362 is determined according to the position of the groove 122 in the heat sink 100. The locating face 354 and the locking faces 364 cooperatively define a circle having a diameter substantially the same as an inner diameter of the heat sink 100 in the groove 122. The locating and locking flanges 352, 362 can thereby be fittingly received in the groove 122.

Figure 2:
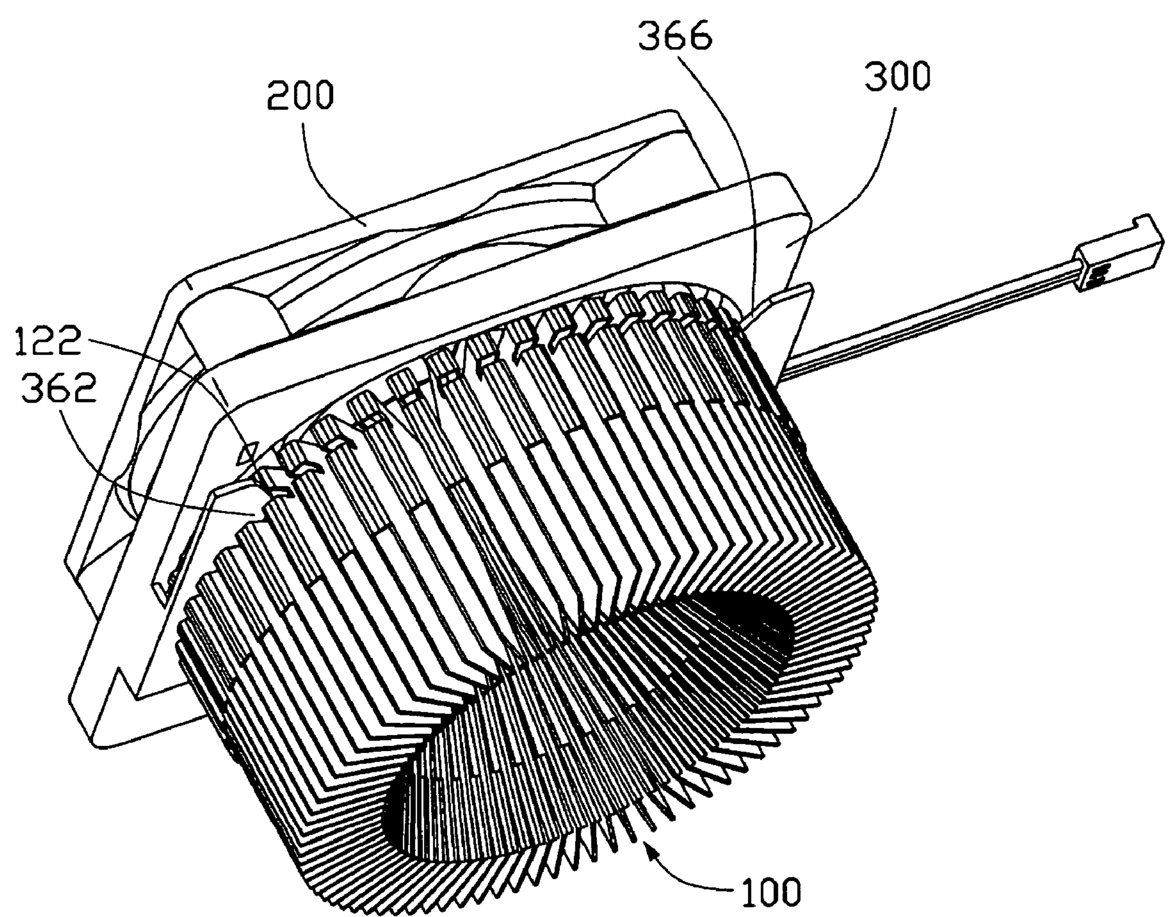
FIG. 2 is an assembled view of FIG. 1.

Referring also to FIG. 2, in assembly of the heat dissipation assembly, the fan 200 is placed on the fan holder 300, with the locating holes 214 receiving the pins 330 of the fan holder 300. The fan 200 is pressed onto the fan holder 300. Outer walls of the fan 200 ride over the guide faces 342 of the hooks 340, until a proximal one of the plates 212 of the fan 220 is snappingly received between the stopping faces 344 of the hooks 340 and the bracket 310 of the fan holder 300. The pins 330 are thus fully received in the locating holes 214, and prevent the fan 200 from moving in directions parallel to the bracket 310. The hooks 340 sandwich the fan 200 against the bracket 310, with the stopping faces 344 preventing the fan 200 from moving away from the fan holder 300.

The base end of the heat sink 100 is attached on the bracket 310 of the fan holder 300. The heat sink 100 is slid over the opening 320 toward the locating portion 350, with an inner periphery of the heat sink 100 in the groove 122 riding along the leading faces 366. The locking flanges 362 resiliently deform away from each other, and said inner periphery of the heat sink 100 snaps from the leading faces 366 to the locking faces 364. Finally, the heat sink 100 reaches the locating portion 350. The locating flange 352 and the locking flanges 362 are received in the groove 122, with the locating face 354 and the locking faces 364 abutting said inner periphery of the heat sink 100. The locating protrusion 356 is received between two fins 110, and prevents the heat sink 100 from rotating.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly comprising:

a heat sink comprising a plurality of radial fins, a circumferential groove being defined in an end portion of the heat sink;

a fan; and a fan holder defining an opening in communication with both the fan and the heat sink, a plurality of securing portions formed from a side of the fan holder and comprising inward flanges received in the groove of the heat sink, inner faces respectively defined in inner sides of the flanges and cooperatively defining a circle having a diameter substantially the same as a diameter of the heat sink measured at the groove, one of the flanges having an inner protrusion extending from the inner face thereof, the inner protrusion disposed between two of the fins.

2. The assembly of claim 1, wherein a plurality of pins and hooks extends from an opposite side of the fan holder, the pins and the hooks cooperatively securing the fan to the fan holder with respect to all three Cartesian axes.

3. The assembly of claim 2, wherein the fan comprises a frame defining a plurality of locating holes therein, the pins of the fan holder being inserted in the locating boles for preventing the fan from moving in directions parallel to the fan holder.

4. The assembly of claim 2, wherein the hooks sandwich the fan against the fan holder.

5. The assembly of claim 4, wherein the books each comprise a stopping face parallel to and spaced from said opposite side of the fan holder, the stopping faces preventing the fan from moving away from the fan holder.

6. The assembly of claim 1, wherein said securing portions comprise a locating portion and a pair of opposing locking portions perpendicular to the locating portion and adjacent opposite ends of the locating portion respectively.

7. The assembly of claim 6, wherein said flanges comprise a locating flange extending from a top of the locating portion, and a pair of locking flanges extending from tops of the locking portions respectively.

8. The assembly of claim 7, wherein said faces comprise an arcuate locating face defined in the inner side of the locating flange a pair of arcuate locking faces respectively defined in the inner sides of the locking flanges.

9. The assembly of claim 8, wherein a leading face is defined at an inner side of each of the locking flanges distal from the locating portion, and the heat sink is received onto the fan holder via the leading faces.

10. The assembly of claim 9, wherein the leading face and the locking face of each of the locking flanges together span an entire length thereof.

11. The assembly of claim 8, wherein the protrusion is formed on a middle of the locating face, for preventing the heat sink from rotating.

12. The assembly of claim 1, wherein the flanges are parallel to and spaced from the fan holder.

13. A heat dissipation assembly comprising:

a heat sink comprising a plurality of spaced fins, the fins defining a circumferential groove at an end portion of the heat sink, the heat sink defining an inner periphery in the groove;

a fan; and a fan holder comprising a bracket having the fan secured to one side thereof, the bracket at an opposite side thereof comprising a pair of opposite locking flanges and a locating flange between the locking flanges, the locking and locating flanges being parallel to the bracket and being received in the groove with inner sides of the locking and locating flanges abutting the inner periphery of the heat sink, the locating flange forming an inner protrusion received between adjacent two of the fins to prevent the heat sink from rotating, wherein said end portion of the heat sink is disposed between the bracket and the flanges.

14. The assembly of claim 13 wherein the locking flanges are substantially perpendicular to the locating flange.

15. The assembly of claim 14, wherein the locking flanges each define a leading face distal from the locating flange, and the heat sink is received onto the fail holder via the leading faces.

16. A method of assembling a fan holder and a beat sink together, comprising steps of:

providing a beat sink with a cylindrical configuration including a plurality of fins outwardly radially extending from an imaginary axis, wherein a circumferential groove formed in edges of one end portions of said fins, the heat sink defining an inner periphery in the groove;

providing a fan holder comprising a pair of curved locking flanges and a curved locating flange between the locking flanges:

having the inner periphery riding along the locking flanges toward the locating flange to resiliently deform the locking flanges away from each other; and having the inner periphery snapped between the locking flanges and having the locating flange received in the groove and abutting against the inner periphery of the heat sink.

17. The method of claim 16, wherein the locating flange forms an inner protrusion received between adjacent two of the fins of the heat sink to prevent the heat sink from rotating.

18. The method of claim 16, wherein the locking flanges and the locating flange commonly form an inner periphery dimensioned substantially the seine as the outer periphery of the heat sink in the groove.

* * * * *